United States Patent
Yeh

(10) Patent No.: US 7,598,823 B2
(45) Date of Patent: Oct. 6, 2009

(54) HIGH-SPEED DIGITAL TRANSMISSION SIGNAL LINE FOR PROVIDING A DESIRED DYNAMIC RESISTANCE

(75) Inventor: Shih-Kun Yeh, Taoyuan Hsieh (TW)

(73) Assignee: Tennrich International Corp., Taoyuan Hsieh (TW)

( * ) Notice: Subject to any disclaimer, the term of this patent is extended or adjusted under 35 U.S.C. 154(b) by 30 days.

(21) Appl. No.: 11/715,504

(22) Filed: Mar. 8, 2007

(65) Prior Publication Data

US 2008/0218285 A1 Sep. 11, 2008

(51) Int. Cl.
*H01P 3/08* (2006.01)

(52) U.S. Cl. .......................... 333/4; 333/238

(58) Field of Classification Search .............. 333/1, 333/4, 5, 238
See application file for complete search history.

(56) References Cited

U.S. PATENT DOCUMENTS

| 4,441,088 | A  | * | 4/1984  | Anderson ...................... 333/1 |
| 5,418,504 | A  | * | 5/1995  | Nottenburg .................... 333/1 |
| 5,519,363 | A  | * | 5/1996  | Boudreau et al. .............. 333/1 |
| 5,982,249 | A  | * | 11/1999 | Bruns ............................ 333/1 |
| 6,885,549 | B2 | * | 4/2005  | Thomason .................. 361/683 |
| 2007/0236303 | A1 | * | 10/2007 | Lee et al. ...................... 333/1 |

* cited by examiner

*Primary Examiner*—Benny Lee
(74) *Attorney, Agent, or Firm*—Troxell Law Office PLLC

(57) ABSTRACT

A high-speed digital transmission signal line providing better dynamic resistance to be applied in an LVDS transmission system to function as an electronic line, an optical line, and a serial advanced technology attachment (SATA), comprises a conductive layer in thickness of 0.018~0.1 mm and in width of 0.2~0.8 mm; a first and a second insulation layers each in thickness of 0.04~0.3 mm being respectively disposed on both sides of the conductive layer; and a ground plate.

8 Claims, 3 Drawing Sheets

HIGH-SPEED DIGITAL TRANSMISSION SIGNAL LINE FOR PROVIDING A DESIRED DYNAMIC RESISTANCE

BACKGROUND OF THE INVENTION (a) Field of the Invention

The present invention is related to a high-speed digital transmission signal line, and more particularly, to one providing better dynamic resistance.

(b) Description of the Prior Art

As illustrated in FIG. 1 of the accompanying drawings, since the signal communication amount between a liquid crystal display and a main unit in a Low voltage Differential Signal (LVDS) transmission system is extremely enormous and operates at a very high frequency, an LVDS receiver 4 of ultra high-speed (1.4 Gb/s), low power consumption, and low voltage electromagnetic radiation is adapted in an HF (High Frequency) signal transmission system mounted between an LCD interface 2 and a system motherboard interface 3, to serve as a signal transmission interface for the LED interface 2. LVDS receiver 4 is connected by means of a transmission line 5 to complete signal connection with a signal transmission interface on the system motherboard interface 3, i.e., a connector socket 31 disposed on thereon, thus to form an LVDS signal transmission system of the prior art.

However, according to the LVDS interface standard defined in ANSI-YUA-EIA-644-1995, the signal transmission line 5 used in the LVDS signal transmission system must a dynamic resistance $Z_0$ of 100Ω±5% so to match the circuit resistance (Z) of the motherboard interface 3 of the system. Moreover the LVDS signal transmission system must satisfy this condition before the system is capable of achieving EMI and noise reduction and correctly execute the signal transmission between the LCD interface (LVDS interface) 2 and the motherboard interface 3 of the system to prevent errors; otherwise, the signal transmission between the LCD interface 2 and the system motherboard interface 3 will generate signal reflection and noise interface resulting in signal loss, deformation and distortion. "Dynamic Resistance 100Ω" on items 2 and 3 indicate the electronic property of dynamic resistance of both sides of the interface are set at 100Ω to comply with the LVDS standard.

At present, the signal transmission line 5 adapted in the LVDS signal transmission system of the prior art is made of a conventional wire cable, a flexible printed circuit (FPC), or a mini coaxial cable designed with a dynamic resistance $Z_0$ of 100Ω±5%; however, flexible flat cables generally available in the market of comparatively simple construction and lower unit cost are not applicable for use in the LVDS signal transmission system of the prior art since their dynamic resistances $Z_0$ are all approximately at 130Ω, which fails to meet standard operation specifications of the LVDS signal transmission system.

SUMMARY OF THE INVENTION

The primary purpose of the present invention is to provide a transmission signal line in a construction that is capable of functioning as an electronic line, an optical line, or a serial advanced technology attachment (SATA) while providing better dynamic resistance when applied in the LVDS signal transmission system.

To achieve this purpose, the transmission signal line construction of the present invention includes a conductive layer, a first insulation layer and a second insulation layer respectively disposed on both sides of the conductive layer, and a grounding plate disposed on the second insulation layer in relation to the opposite side of the conductive layer. The conductive layer is 0.018~0.1 mm thick and 0.2~0.8 mm wide, and each of the first and the second insulation layer is 0.40~0.3 mm thick.

DETAILED DESCRIPTION OF THE PREFERRED EMBODIMENTS

Figure 1:
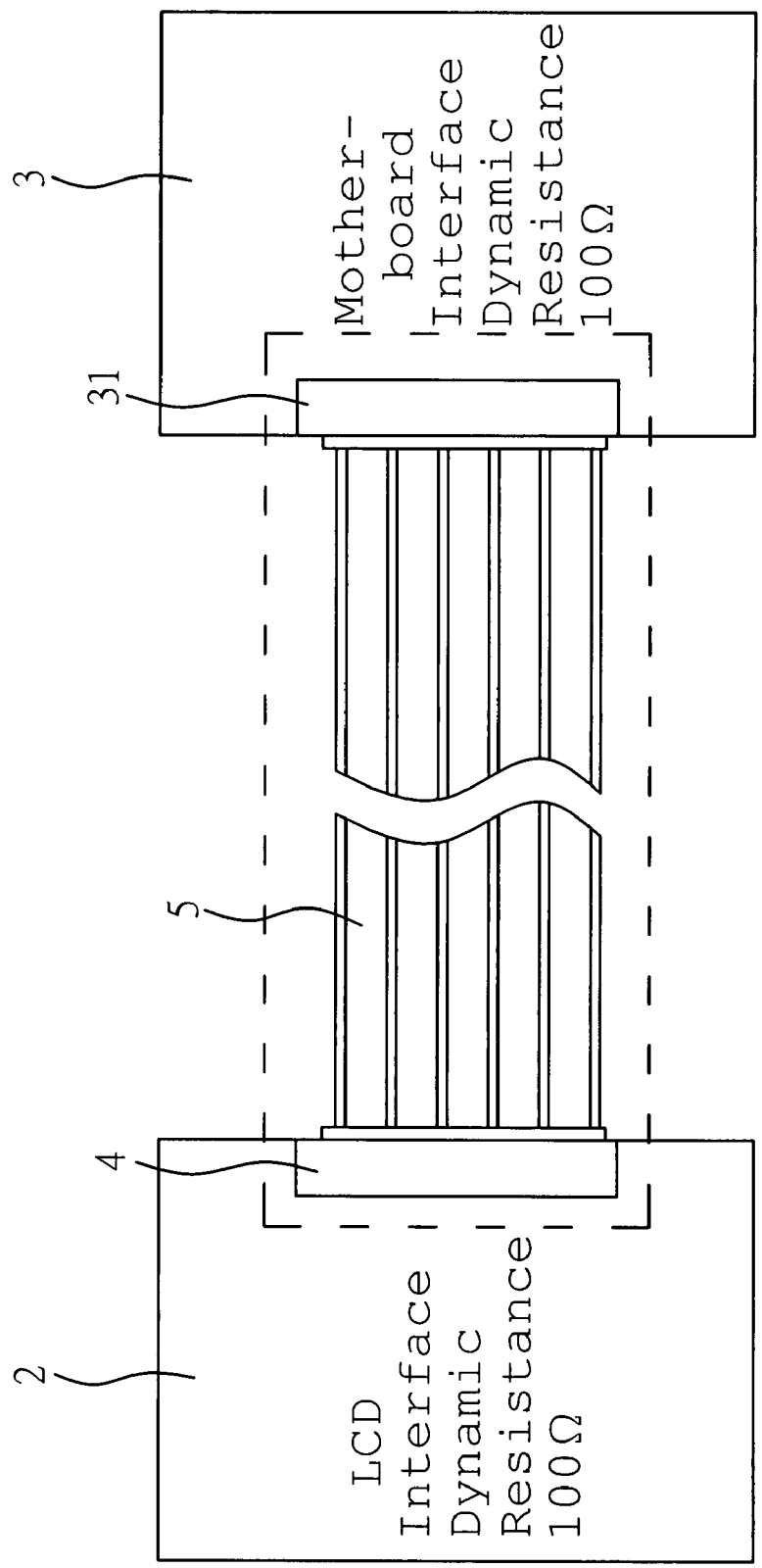
FIG. 1 is a schematic view showing LVDS signal transmission system between LCD interface and system motherboard interface of the prior art.
Figure 2:
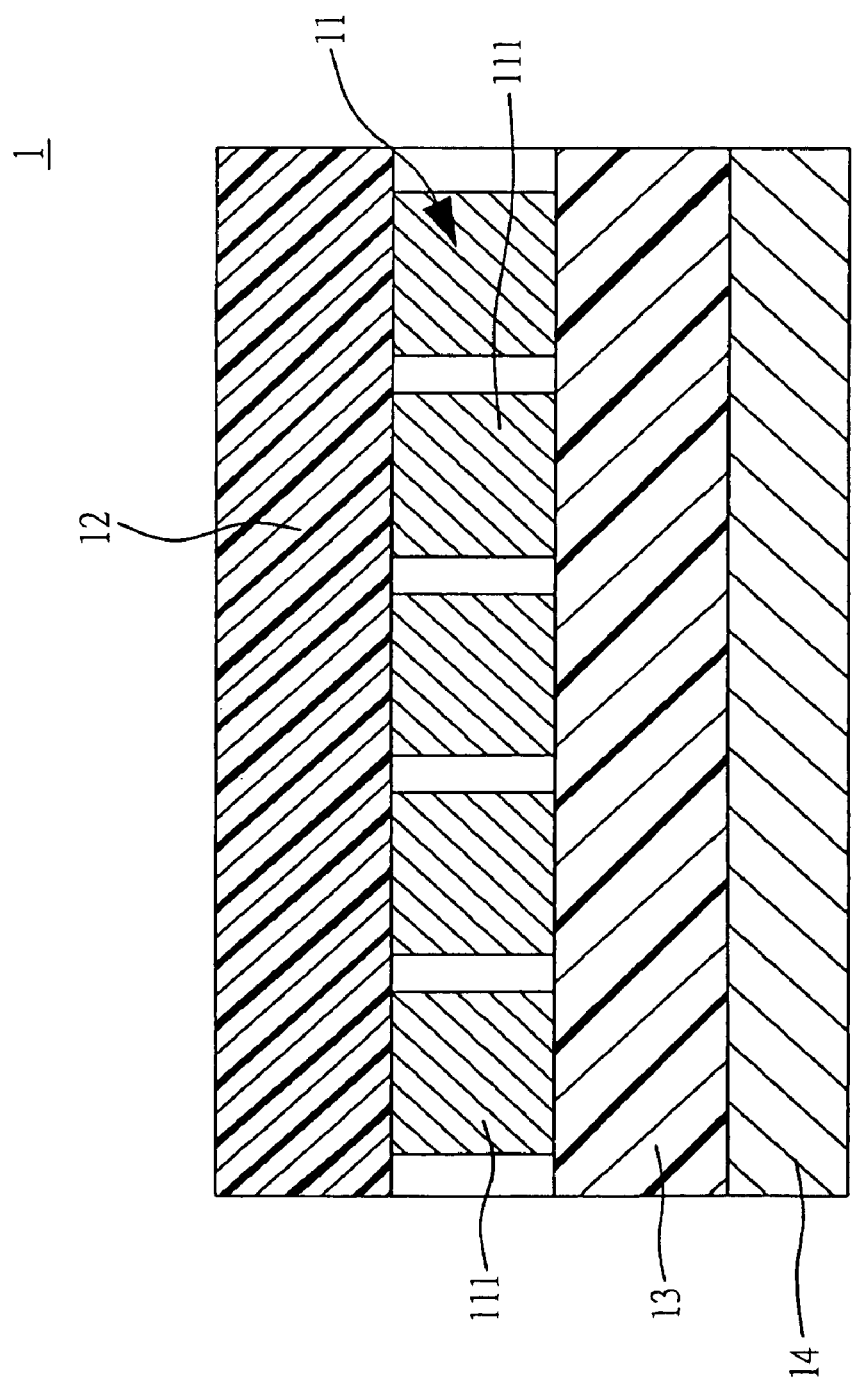
FIG. 2 is a sectional view of a transmission signal line of the present invention.

Referring to FIG. 2 for a schematic view showing a construction of a transmission signal line of the present invention, a transmission signal line 1 includes a conductive layer 11 comprised of multiple copper wires 111 arranged in parallel to one another, and the general thickness and width of the conductive layer 11 are respectively 0.018~0.1 mm and 0.2~0.8 mm; a first insulation layer 12 disposed on one side of the conductive layer 11 is made of Polyethylene terephthalate (PET) in thickness of 0.04~0.3 mm; a second insulation layer 13 disposed on the other side of the conductive layer 11 in opposite to where the first insulation layer 12 is made of PET or polyimide in thickness of 0.04~0.3 mm; and a grounding plate 14 disposed on the second insulation layer 13 in relation to the opposite side of the conductive layer 11 is made of copper or aluminum.

Both of the first and the second insulation layers 12, 13 and the conductive layer 11 being clad in the middle constitute an integral part of the present invention to feature a simple manufacturing process, lower production cost, and providing good properties of flexibility, flame retardant, and cold/heat resistance. Furthermore, the dynamic resistance $Z_0$ of the transmission signal line 1 is correlated to and in an inverse proportion with the width and thickness of the conductive layer 11 of the transmission signal line 1.

With increased width or thickness of the conductive layer 11 of the transmission signal line 1, the dynamic resistance $Z_0$ of the transmission signal line 1 drops; conversely, with decreased width or thickness of the conductive layer 11 of the transmission signal line 1, the dynamic resistance $Z_0$ of the transmission signal line 1 rises.

The dynamic resistance $Z_0$ is also correlated to and in an inverse proportion with the thickness of the first and the second insulation layers 12, 13. As the thickness of the first insulation layer 12 or the second insulation layer 13 of the transmission signal line 1 increases, the dynamic resistance $Z_0$ of the transmission signal line 1 drops; conversely, when the thickness of the first insulation layer 12 or the second insulation layer 13 of the transmission signal line 1 decreases, the dynamic resistance $Z_0$ of the transmission signal line 1 rises.

Accordingly, the thickness of the conductive layer 11 of the present invention is adjusted to 0.017~0.1 mm; and the width, 0.2~0.8 mm; and the thickness each of the first and the second insulation layers 12, 13 is adjusted to 0.04~0.3 mm to constitute the transmission signal line 1 with a better dynamic resistance $Z_0$ of 100Ω±5% for the transmission signal line 1 to serve as an electronic line, an optical line, or a serial advanced technology attachment (SATA) and to be applied in the LVDS transmission system.

Figure 3:
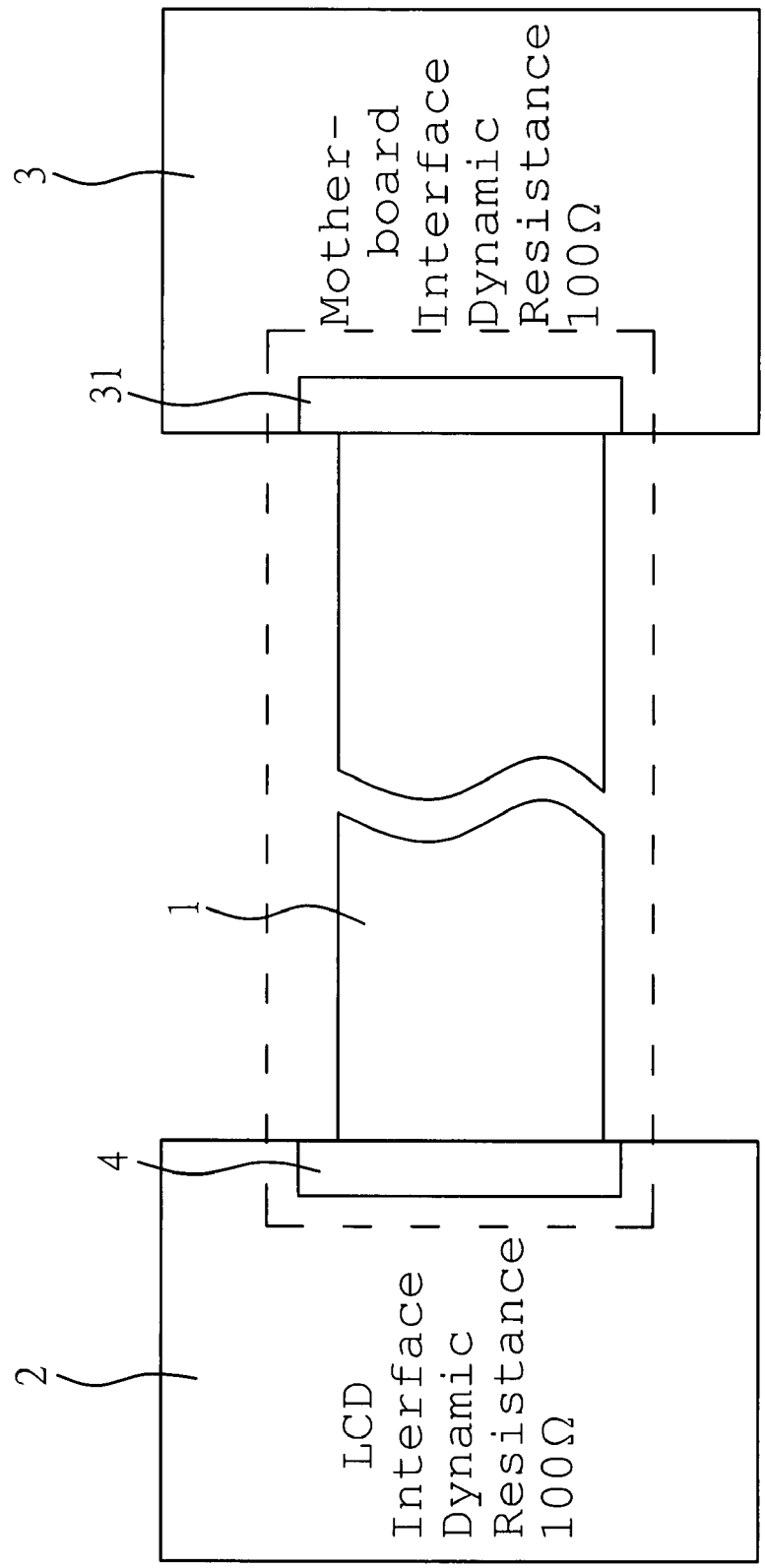
FIG. 3 is a schematic view showing the transmission signal line of the present invention is applied in an LVDS signal transmission system.

As illustrated in FIG. 3 for a schematic view of the transmission signal line of the present invention applied in the LVDS transmission system, the LVDS transmission system relates to an HF signal transmission system mounted at where between the LCD interface 2 and the system motherboard interface 3. Wherein, an LVDS receiver 4 featuring ultra high-speed (1.4 Gb/s), lower power consumption and low EM radiation is adapted to function as a signal transmission interface for the LCD interface 2 and to complete signal connection through the transmission signal line 1 to a signal transmission interface, i.e., a connector socket 31, disposed on the system other board interface 3 to correct the defect that a conventional transmission signal line is prevented from being applied in the LVDS signal transmission system.

It is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

I claim:

1. A high-speed digital transmission signal line capable of providing a desired dynamic resistance includes a conductive layer in thickness of 0.018~0.1 mm and in width of 0.2~0.8 mm;
    a first insulation layer in thickness of 0.04~0.3 mm being disposed on one side of the conductive layer; a second insulation layer in thickness of 0.01~0.3 mm being disposed on the other side of the conductive layer in relation to the first insulation layer; and
    a ground plate disposed to the second insulation layer in relation to the opposite side of the conductive layer.

2. The high-speed digital transmission signal line as claimed in claim 1, wherein each of both of the first and the second insulation layers is PET or polyimide.

3. The high-speed digital transmission signal line as claimed in claim 1, wherein the conductive layer is comprised of multiple copper wires arranged in parallel with one another.

4. The high-speed digital transmission signal line as claimed in claim 1, wherein the ground plate is made of copper or aluminum.

5. The high-speed digital transmission signal line as claimed in claim 1, wherein the transmission signal line functions as an electronic line.

6. The high-speed digital transmission signal line as claimed in claim 1, wherein the transmission signal line functions as an optical line.

7. The high-speed digital transmission signal line as claimed in claim 1, wherein the transmission signal line functions as a serial advanced technology attachment (SATA).

8. The high-speed digital transmission signal line as claimed in claim 1, wherein the transmission signal line is applied in a low voltage differential signal (LVDS) transmission system.

* * * * *